(12) United States Patent
Choi et al.

(10) Patent No.: US 7,193,921 B2
(45) Date of Patent: Mar. 20, 2007

(54) CASCADE WAKE-UP CIRCUIT PREVENTING POWER NOISE IN MEMORY DEVICE

(75) Inventors: Hyun-su Choi, Suwon-si (KR); Kyeong-rae Kim, Yongin-si (KR)

(73) Assignee: Samsung Electronics, Co., Ltd. (KR)

( * ) Notice: Subject to any disclaimer, the term of this patent is extended or adjusted under 35 U.S.C. 154(b) by 150 days.

(21) Appl. No.: 11/103,047

(22) Filed: Apr. 11, 2005

(65) Prior Publication Data
US 2005/0286322 A1 Dec. 29, 2005

(30) Foreign Application Priority Data
Jun. 25, 2004 (KR) ........................ 10-2004-0048041

(51) Int. Cl.
G11C 5/14 (2006.01)
(52) U.S. Cl. ....................................... 365/229; 365/194
(58) Field of Classification Search ................ 365/229, 365/194, 226, 154
See application file for complete search history.

(56) References Cited
U.S. PATENT DOCUMENTS

| | | | |
|---|---|---|---|
| 5,812,482 A | 9/1998 | Jiang et al. | ............ 365/230.06 |
| 6,256,252 B1* | 7/2001 | Arimoto | ...................... 365/227 |
| 6,577,553 B2* | 6/2003 | Makabe et al. | ........ 365/230.06 |
| 2006/0152966 A1* | 7/2006 | Park | ........................... 365/154 |

FOREIGN PATENT DOCUMENTS

| | | |
|---|---|---|
| KR | 10-0225951 | 7/1999 |
| KR | 10-0335397 | 4/2002 |
| KR | 2003-0055998 | 7/2003 |

* cited by examiner

Primary Examiner—Anh Phung
(74) Attorney, Agent, or Firm—Mills & Onello LLP

(57) ABSTRACT

A wake-up circuit of a memory device employs a cascade chain structure in which bit lines are divided into a plurality of blocks, and if the bit lines of one of the blocks are determined to have undergone a wake-up operation based on a bit line voltage fed back in the block, the wake-up operation is performed on a subsequent block. Accordingly, a wake-up delay can be varied, and therefore peak currents can be controlled, thereby reducing overall system power noise.

18 Claims, 7 Drawing Sheets

CASCADE WAKE-UP CIRCUIT PREVENTING POWER NOISE IN MEMORY DEVICE

BACKGROUND OF THE INVENTION

This application claims the priority of Korean Patent Application No. 2004-48041, filed on Jun. 25, 2004, in the Korean Intellectual Property Office, the disclosure of which is incorporated herein in its entirety by reference.

1. Field of the Invention

The present invention relates to a memory device, and more particularly, to a wake-up method of and a wake-up circuit for converting a sleep mode to an active mode in a memory device.

2. Description of the Related Art

In a semiconductor memory device, it is very important to prevent malfunction that is generated as a result of noise in the power supply. There are several sources of noise when a semiconductor memory device operates. A peak current, which is generated when discharged parts of a circuit are simultaneously precharged, is a typical source if such noise.

In particular, in a memory cell array, there is a high possibility that large peak currents will be generated in a bit line pair when reading data of a bit cell.

One of the primary considerations regarding the type of memory that is commonly used in portable telephone systems is amount of loss due to leakage current. To this end, several architectures have been proposed, and an architecture in which leakage current is reduced by placing the memory device in a sleep mode that deactivates the application of the power supply voltage to the memory device is widely used. However, a large amount of peak current is generated during a wake-up operation in which the memory device transitions from a sleep mode to an active mode. The peak current causes an IR drop due to the resistance of the power line, and the power supply voltage supplied to the memory cell therefore drops. In a worst-case scenario, the power supply voltage can drop below a retention voltage of the memory cell, which can therefore result in data loss of the memory cell.

FIGS. 1 and 2 are circuit diagrams of wake-up circuits of a conventional SRAM (static random access memory) memory device.

In a power supply voltage power-off structure, which is used to implement a low-leakage current SRAM, all bit lines are precharged from a ground voltage to the power supply voltage using a wake-up operation when switching the SRAM from a sleep mode to a stand-by mode during the wake-up operation. During this operation, a peak current is generated, in turn causing a voltage drop.

In the wake-up circuit as shown in FIG. 1, all precharge circuits 10 included in a column simultaneously operate during the wake-up operation. However, when a control signal SC is applied as shown in FIG. 1, if all of the precharge circuits 10 connected to the control signal line 12 simultaneously start operating, all of the bit line pairs respectively connected to the precharge circuits 10 are concurrently precharged to the power supply voltage, and thereby the power supply voltage supplied to the memory drops. That is, data of the SRAM bit cell is threatened by the IR drop occurring due to the reduction of the power supply voltage.

The wake-up circuit shown in FIG. 2 distributes the peak currents to resolve the problems that can occur in the wake-up circuit illustrated in FIG. 1. Referring to FIG. 2, a plurality of bit line pairs which are connected to the memory cell are divided into a plurality of blocks 2_1, 2_m, . . . , 2_n. In addition, each of the plurality of divided blocks includes a plurality of inverter chains 26, 28 . . . to distribute the peak currents.

A control signal SC is input via a wake-up control line 24 and precharges the bit line pairs included in the first block 2_1. Specifically, the control signal SC is input to a precharge circuit 20 included in the first block 2_1 to precharge the bit lines connected to the precharge circuit 20 to the power supply voltage VDD. The control signal SC applied to the first block 2_1 is delayed by inverter chain 26 and a delayed control signal SC1 is output by the inverter chain 26 and input to a precharge circuit 22 included in the second block 2_2 to precharge the bit lines connected to the precharge circuit 22 to the power supply voltage VDD. The delayed control signal SC1 is then delayed by inverter chain 28, and a second delayed control signal SC2 output by the inverter chain 28 precharges bit line pairs of the subsequent block.

The inverter chains 26, 28, allow the wake-up operation to commence in a subsequent block without determining whether the wake-up operation has been completed in a previous block. Therefore, the peak currents may not be properly distributed. Also, when the delay time of the inverter chains 26, 28, are increased to preserve data of the memory cell, timing loss can result from an increased wake-up timing margin.

FIG. 3 is a timing diagram of the control signals SC, SC1 and SC2 of the wake-up circuit shown in FIG. 2. The control signal SC is output from a control signal outputting unit (not shown), and the control signal SC1 output from the inverter chain 26 is delayed by a delay time d after the control signal SC1 is output.

As shown in FIG. 3, each of the inverter chains delays the input control signal for the delay time d regardless of whether the associated bit lines wake-up.

FIG. 4 is a graph illustrating the generated power supply voltage when the wake-up circuit shown in FIG. 2 is in a wake-up mode. Referring to FIG. 4, when using the inverter chains 26, 28, having the fixed delay times d illustrated in FIG. 2, since bit lines of subsequent blocks start waking up before bit lines of previous blocks have sufficiently awoken, an IR drop occurs and, as shown in FIG. 4, the power supply voltage (VDD) drops to a low voltage. Alternatively, when the delay time in the inverter chain is increased by increasing the number of inverters, the overall time required for the wake-up operation is increased.

SUMMARY OF THE INVENTION

The present invention provides a cascade wake-up circuit which can sequentially wake-up a plurality of blocks.

The present invention also provides a wake-up circuit with a smaller circuit size than a conventional inverter chain.

The present invention additionally provides a wake-up circuit which affects the wake-up operation of a memory device but does not affect the speed of other operations.

In one aspect, the present invention is directed to a wake-up circuit of a memory device in which bit line pairs connected to a plurality of memory cells are precharged through a delay chain structure. The wake-up circuit comprises: a plurality of bit line pairs corresponding to a plurality of memory blocks; a wake-up control signal outputting unit that outputs a control signal for precharging the bit line pairs in order to wake-up the memory device from a sleep mode to an active mode; and a plurality of precharge delay units that transmits the control signal to bit line pairs associated with a subsequent memory block when the output control signal and bit line pairs within a previous memory block have undergone a wake-up operation.

In one embodiment, the control signal output from the wake-up control signal outputting unit is sequentially output to bit line pairs of the plurality of memory blocks via the precharge delay units.

In another embodiment, the wake-up circuit further includes: connection units that transmit the control signal to the bit lines; and precharge circuits respectively precharging the bit line pairs. Each connection unit includes: a NAND gate that performs a NAND operation on the control signal and a precharge signal; and a connection delay unit that delays the output of the NAND gate and that outputs the delayed output to the bit line pair.

In another embodiment, the connection delay unit includes a plurality of inverters.

In another embodiment, the control signal output from the connection delay unit is input to a precharge switch unit to deliver a power supply voltage to the bit line pair.

In another embodiment, the precharge delay unit includes: a first switch that delivers a signal from the bit line pairs to a first node in response to an output signal of the precharge delay unit; a NAND gate that performs a NAND operation on the control signal received from the previous block and a signal received from the first node and that outputs the result to a second node; a second switch that delivers a power supply voltage to the first node in response to a signal received from the second node; and an inverter that inverts the signal received from the second node and that transmits the control signal as the output signal of the precharge delay unit to the subsequent block.

In another embodiment, the first and second switches are PMOS transistors.

In another embodiment, the memory device is an SRAM (static random access memory) device.

In another aspect, the present invention is directed to a memory device comprising: a plurality of memory cells; a plurality of bit line pairs connected to the plurality of memory cells and divided into a plurality of memory blocks; a wake-up control signal outputting unit that outputs a control signal for precharging the bit line pairs in order to wake up the memory device from a sleep mode to an active mode; and a plurality of precharge delay units that transmit the control signal to bit line pairs associated with a subsequent memory block when the output control signal and bit line pairs within a previous memory block are determined to have performed a wake-up operation.

In one embodiment, the memory device further comprises: connection units that transmit the control signal to the bit lines; and precharge circuits respectively precharging the bit line pairs. Each connection unit includes: a NAND gate that performs a NAND operation on the control signal and a precharge signal; and a connection delay unit that delays the output of the NAND gate and that outputs the delayed output to the bit line pair.

In another embodiment, the connection delay unit includes a plurality of inverters.

In another embodiment, the control signal output from the connection delay unit is input to a precharge switch unit to deliver a power supply voltage to the bit line pair.

In another embodiment, the precharge delay unit includes: a first switch that delivers a signal from the bit line pairs to a first node in response to an output signal of the precharge delay unit; a NAND gate that performs a NAND operation on the control signal received from the previous block and a signal received from the first node and that outputs the result to a second node; a second switch that delivers a power supply voltage to the first node in response to a signal received from the second node; and an inverter that inverts the signal received from the second node and that transmits the control signal as the output signal of the precharge delay unit to the subsequent block.

In another embodiment, the first and second switches are PMOS transistors.

In another embodiment, the memory device is an SRAM device.

In another aspect, the present invention is directed to a wake-up method of a memory device in which bit line pairs of a plurality of memory cells divided into a plurality of memory blocks connected to a single word line are transitioned from a sleep mode to an active mode. The method comprises outputting a wake-up control signal; precharging the bit line pairs corresponding to one of the memory blocks; determining whether the bit line pairs within the one of the blocks have undergone a wake-up operation; and transmitting the wake-up control signal to bit line pairs corresponding to a subsequent block if the bit line pairs of the one of the blocks have undergone the wake-up operation.

In one embodiment, determining includes: feeding back precharge voltages of the bit line pairs within the one of the blocks to a control signal delay unit in response to the wake-up control signal; and performing a logic operation on the precharge voltages of the bit line pairs corresponding to the one of the blocks and the wake-up control signal and outputting the result of the logic operating in the control signal delay unit.

In another embodiment, the memory device is an SRAM device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which embodiments of the invention are shown.

In the present invention, a cascade-type wake-up circuit is provided in which a subsequent block is placed in a wake-up mode after a previous block has been placed in wake-up mode. Further, the wake-up circuit of the present invention is smaller in size than a conventional wake-up circuit of the type including an inverter chain. In addition, the wake up circuit of the present invention can detect a change in a wake-up delay caused by certain processes, and can thereby control the peak current by using a bit line of a previous block as an input of a NAND feedback structure. Also, the wake-up circuit affects only the wake-up operation of the memory device and does not influence the performance of other system operations.

Figure 5:
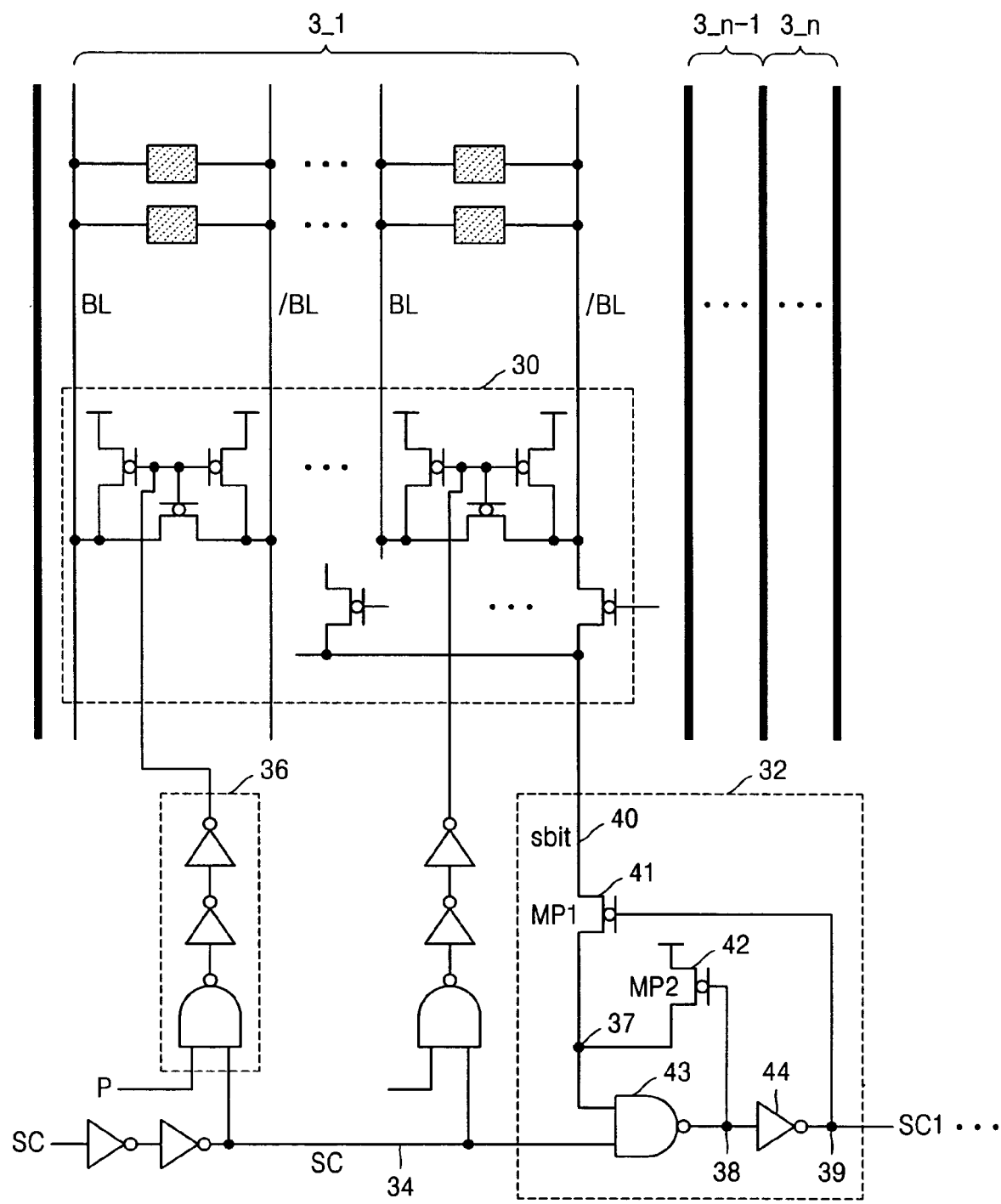
FIG. 5 is a circuit diagram of a wake-up circuit of an SRAM according to an embodiment of the present invention.

FIG. 5 is a circuit diagram of a wake-up circuit of an SRAM device according to an embodiment of the present invention.

Referring to FIG. 5, the SRAM wake-up circuit includes bit line pairs of a plurality of memory cells that are connected to a single word line and precharged via a delay chain structure. To this end, the wake-up circuit includes a plurality of bit line pairs BL and /BL which are divided into a plurality of blocks 3_1, . . . , 3_n–1 and 3_n, a wake-up control signal outputting unit (not shown), a connection unit 36, a precharge circuit 30, and a precharge connection unit 32.

The wake-up control signal outputting unit outputs a control signal SC for precharging bit line pairs in order to awaken a memory device from a sleep mode. The connection unit 36 transfers the control signal SC to precharge circuit 30 which precharges bit line pairs BL and /BL. The precharge delay unit 32 determines whether the control signal SC output by the wake-up control signal outputting unit has resulted in the awakening of a corresponding plurality of blocks and bit line pairs associated with a previous block, and, if so, the control signal SC is then applied to bit line pairs associated with a subsequent block.

Since the circuit structures and functions of the precharge circuit 30 and the connection unit 36 are the same as in the conventional art, detailed descriptions thereof are omitted.

The precharge delay unit 32 includes a first switch 41 for transmitting a signal 'sbit' 40 from the bit line pair BL and /BL to a first node 37 in response to an output signal of the precharge delay unit 32, a NAND gate 43 for performing a NAND operation on the control signal SC input to the previous block 3_1 and a signal received from the first node 37 and for providing the output signal of the NAND gate to a second node 38, a second switch 42 for delivering a power supply voltage VDD to the first node 37 in response to a signal received from the second node 38, and an inverter 44 for inverting a signal received from the second node 38 and for transmitting a control signal SC1 to a subsequent block.

In this exemplary embodiment, the first switch 41 and the second switch 42 are PMOS transistors, and are turned on when a signal input to a gate is at a low level.

Referring to FIG. 5, when the SRAM memory device is in a sleep mode, mode control signals SC, SC1, . . . SCn begin to transition to a low level. Accordingly, the second node 38 is at a high level and the second switch 42 is maintained in an inactive condition. Since the control signal SC1 remains at a low level, the first switch 41 is maintained in an active condition. Alternatively, when the SRAM memory device changes from an active mode to the sleep mode, the control signals SC, SC1, . . . , SCn are caused to sequentially transition to a low level at intervals of a fixed time delay t1.

When the SRAM device is in a wake-up mode, during which the SRAM device transitions from the sleep mode to the active mode, the control signal SC transitions to a high level. Then, the control signal SC at a high level is transmitted to the precharge circuit 30 to precharge bit line pairs BL and /BL included in the first block 3_1. Therefore, the signal 'sbit' output from the bit line (/BL) to the precharge delay unit 32 transitions to a high level.

Since the output signal SC1 of the inverter 44 is still at a low level, the first switch MP1 remains in a turned-on condition. Hence, the signal 'sbit' is transmitted from the bit line (/BL) to the first node 37, and the output of the NAND gate 43 transmits at a low level. Accordingly, since the electric potential of the second node 38, which is an output node of the NAND gate 43, is low, the second switch 42 is turned on and the power supply voltage VDD is supplied to the first node 37. Then, the control signal SC1 output from the inverter 44 transmits a high level, which in turn causes a precharge operation of the bit line pair BL and /BL of the subsequent block to commence.

If the bit line pairs BL and /BL included in the previous block are not sufficiently precharged, the output of the NAND gate 43 is at a high level and the control signal SC1 output from the precharge delay unit 32 stays at a low level because the signal 'sbit' fedback from the bit line (/BL) to the precharge delay unit 32 is at a low level. Therefore, if the bit line pairs BL and /BL included in the previous block are not sufficiently precharged, the control signals for controlling bit line pairs BL and /BL included in subsequent blocks are kept at a low level, and thus the wake-up operation does not proceed to the subsequent blocks.

That is, only when the bit line pairs BL and /BL included in the previous block are sufficiently precharged is the control signal of the precharge delay unit 32 delivered to the subsequent block, according to the signal 'sbit' fedback from the bit line pair BL and /BL.

Table 1 illustrates the status of each signal and each switch in the sleep mode and the wake-up mode.

TABLE 1

| Sleep mode | SC="L" | Mp2=off<br>Mp1=on; affected by the sbit<br>SC1~SCn="L" |
|---|---|---|
| Wake-up mode | SC="H" | sbit="L"→ "H"; precharged by the wake-up operation<br>Mp2=off → on; after sbit="H"<br>Mp1=on → off; not affected by sbit after off<br>SC1="L → H"<br>.<br>.<br>.<br>SCn="L → H" |

That is, in FIG. 5, the wake-up operation is performed by inputting the control signal SC, and a signal that indicates that all columns in a first block of a plurality of blocks, which are divided to reduce peak currents, have risen from the discharged voltage level ΔV to the power supply voltage VDD. The signal 'sbit' fedback from the bit line /BL rises to the power supply voltage VDD following the voltage of the column and the control signal SC1 of the subsequent block being generated by the NAND gate. By repeating this operation, the plurality of blocks are sequentially awakened, and power noise is reduced by distributing wake-up currents.

The first switch 41 transmits the bit line voltage 'sbit' when the wake-up operation is performed, and blocks the bit line voltage 'sbit' during dynamic (write/read) operations. The second switch 42 maintains the input level of the NAND gate when the first switch 41 is off. The wake-up circuit can be configured such that the subsequent block operates after the wake-up operation is sufficiently performed on the previous block by appropriately setting the logic threshold voltage of the NAND gate by selecting appropriate sizes of transistors.

Figure 6:
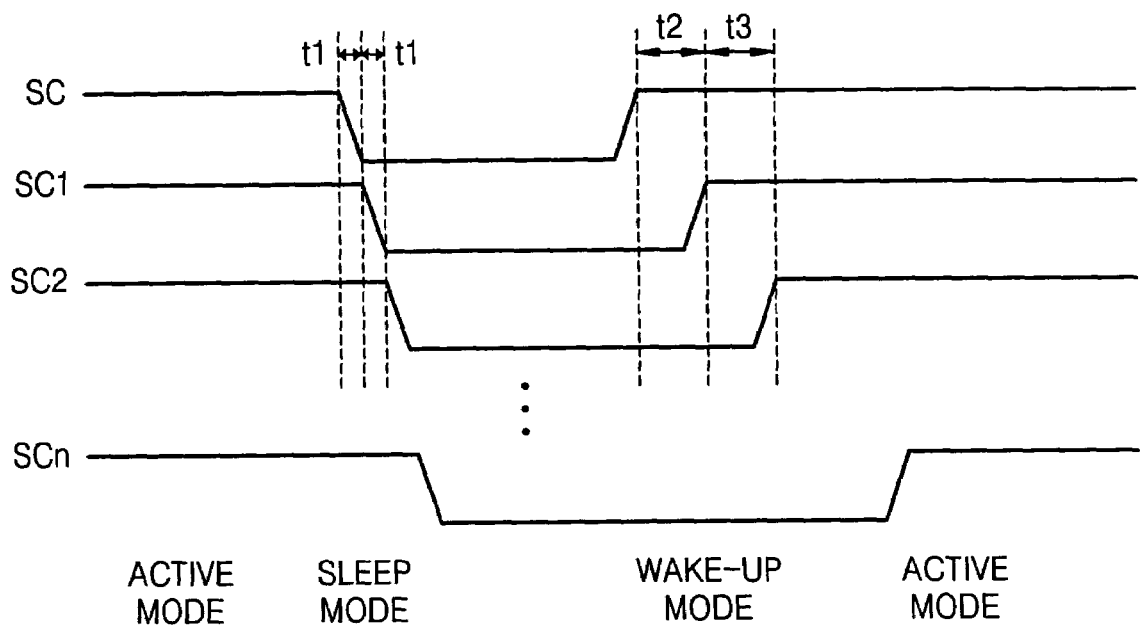
FIG. 6 is a timing diagram of a control signal of the wake-up circuit illustrated in FIG. 5.

FIG. 6 is a timing diagram of control signals of the wake-up circuit illustrated in FIG. 5. The control signals SC, SC1, SC2, ..., SCn are respectively emitted from the precharge delay units connected in series. The control signals SC, SC1, SC2, ..., SCn control a bit line of the first block, a bit line of the second block, a bit line of the third block, and a bit line of nth block, respectively.

When the SRAM transitions from the active mode to the sleep mode, transition of each of the control signals SC, SC1, SC2, ..., SCn is delayed for the set delay time t1 and output. Further, in the wake-up mode in which the SRAM transits from the sleep mode back to the active mode, each control signal is delayed by a variable delay time (t2 and t3 in FIG. 6) until the bit lines within a given block have been awakened sufficiently, and output. The delay times t2 and t3 denote times when bit lines within a block are sufficiently awakened, and can vary from block to block.

Figure 7:
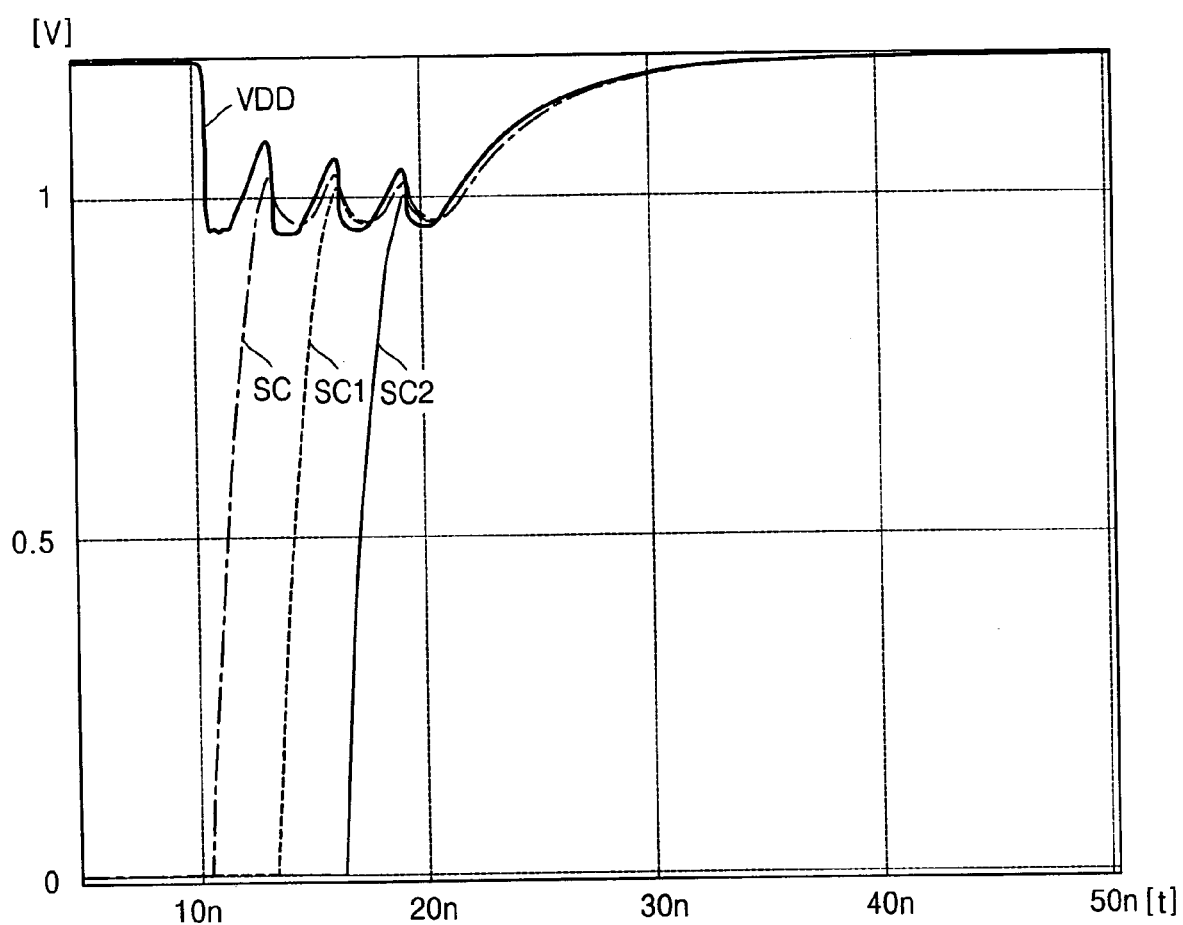
FIG. 7 is a graph illustrating a generated power supply voltage when the wake-up circuit illustrated in FIG. 5 is in a wake-up mode.

FIG. 7 is a graph illustrating a generated power supply voltage when the wake-up circuit illustrated in FIG. 5 is in the wake-up mode.

Figure 4:
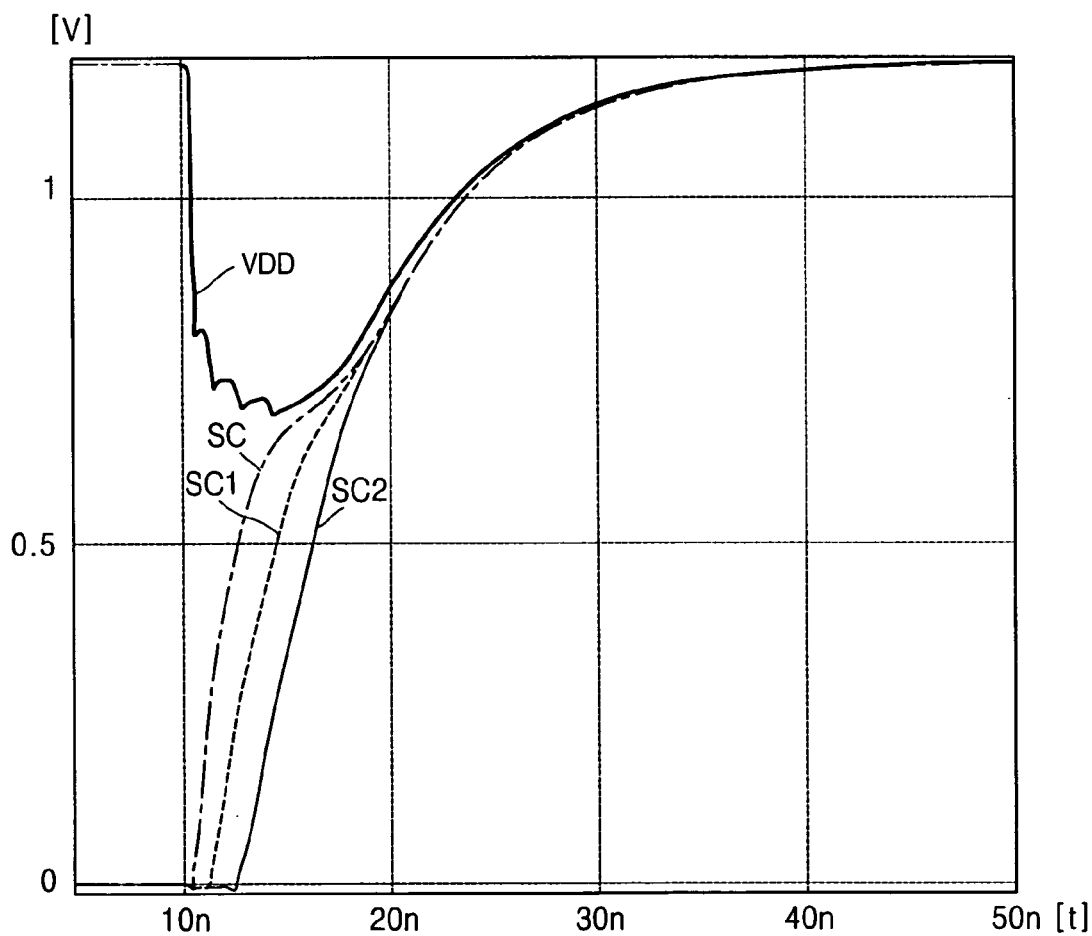
FIG. 4 is a graph illustrating a generated power supply voltage when the circuit shown in FIG. 2 is in a wake-up mode.

Referring to FIG. 7, since each control signal is based on the voltage of the signal 'sbit' fedback from bit lines BL and /BL which have been sufficiently awakened in the previous block, the distributed draw of wake-up currents minimizes the system IR drop. Accordingly, as shown in FIG. 7, the drop in power supply voltage VDD resulting from the wake-up operation is remarkably reduced as compared to that illustrated in FIG. 4.

Figure 8:
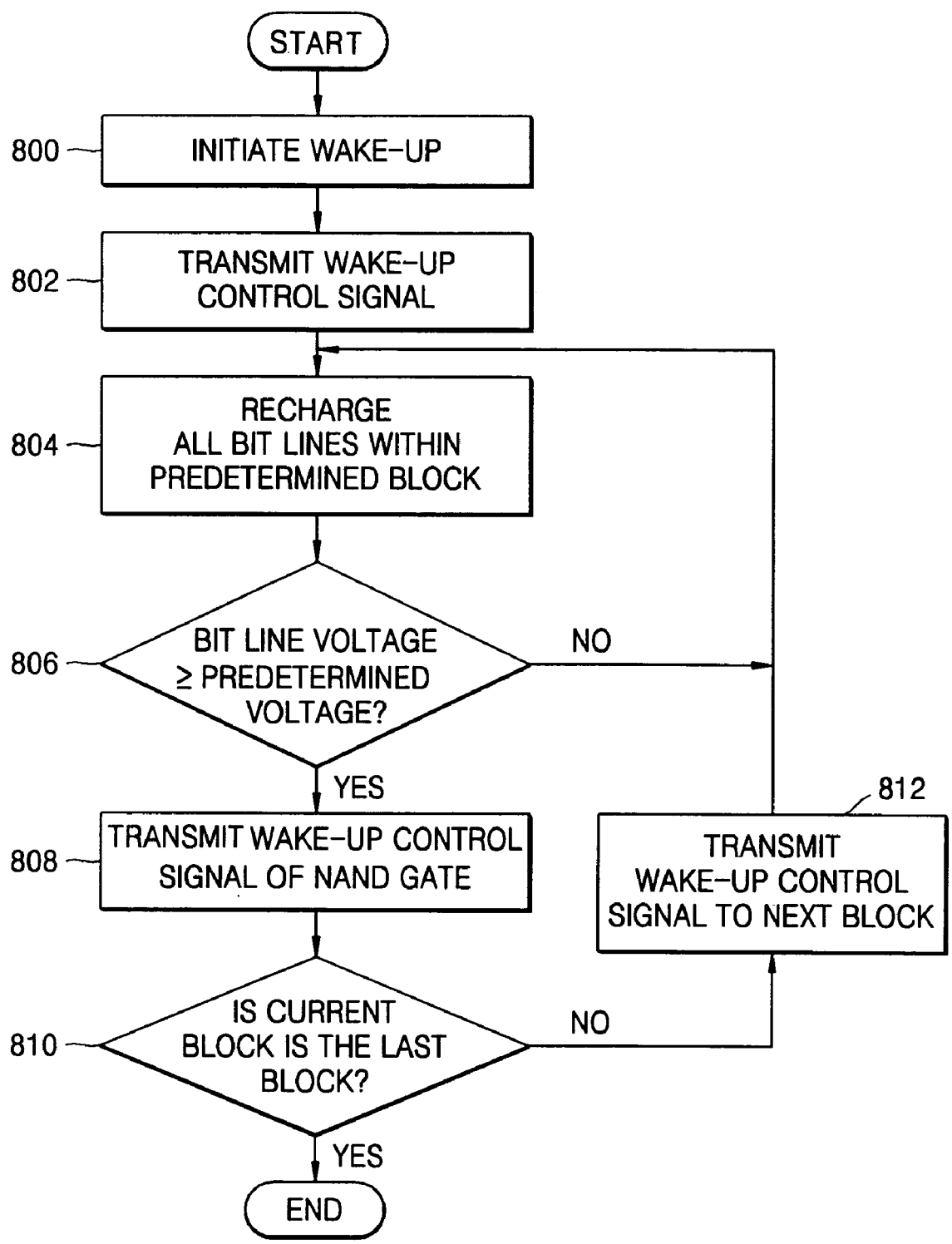
FIG. 8 is a flow diagram illustrating a wake-up method of the SRAM according to another embodiment of the present invention.

FIG. 8 is a flowchart illustrating a wake-up method of a SRAM according to an embodiment of the present invention.

Referring to FIG. 8, a host computer or other external control system instructs the SRAM in a sleep mode to wake up to an active mode (operation 800). Then, the wake-up control signal is transmitted (operation 802), and all bit lines within a first block are precharged (operation 804). The precharge delay unit 32 determines whether the fedback bit line voltage within the block is greater than a predetermined voltage (operation 806). If the bit line voltage is not high enough, the precharge delay unit does not transmit the control signal to the subsequent block, and waits for the bit line within the block to sufficiently wake up.

When the bit line voltage is greater than the predetermined voltage, the NAND gate of the precharge delay unit transmits the wake-up control signal (operation 808). If the block is the last block (operation 810), the wake-up operation ends, or if the block is not the last block, the precharge delay unit transmits the wake-up control signal to the subsequent block (operation 812). Then, all bit lines within the subsequent block are precharged (operation 804).

Figure 1:
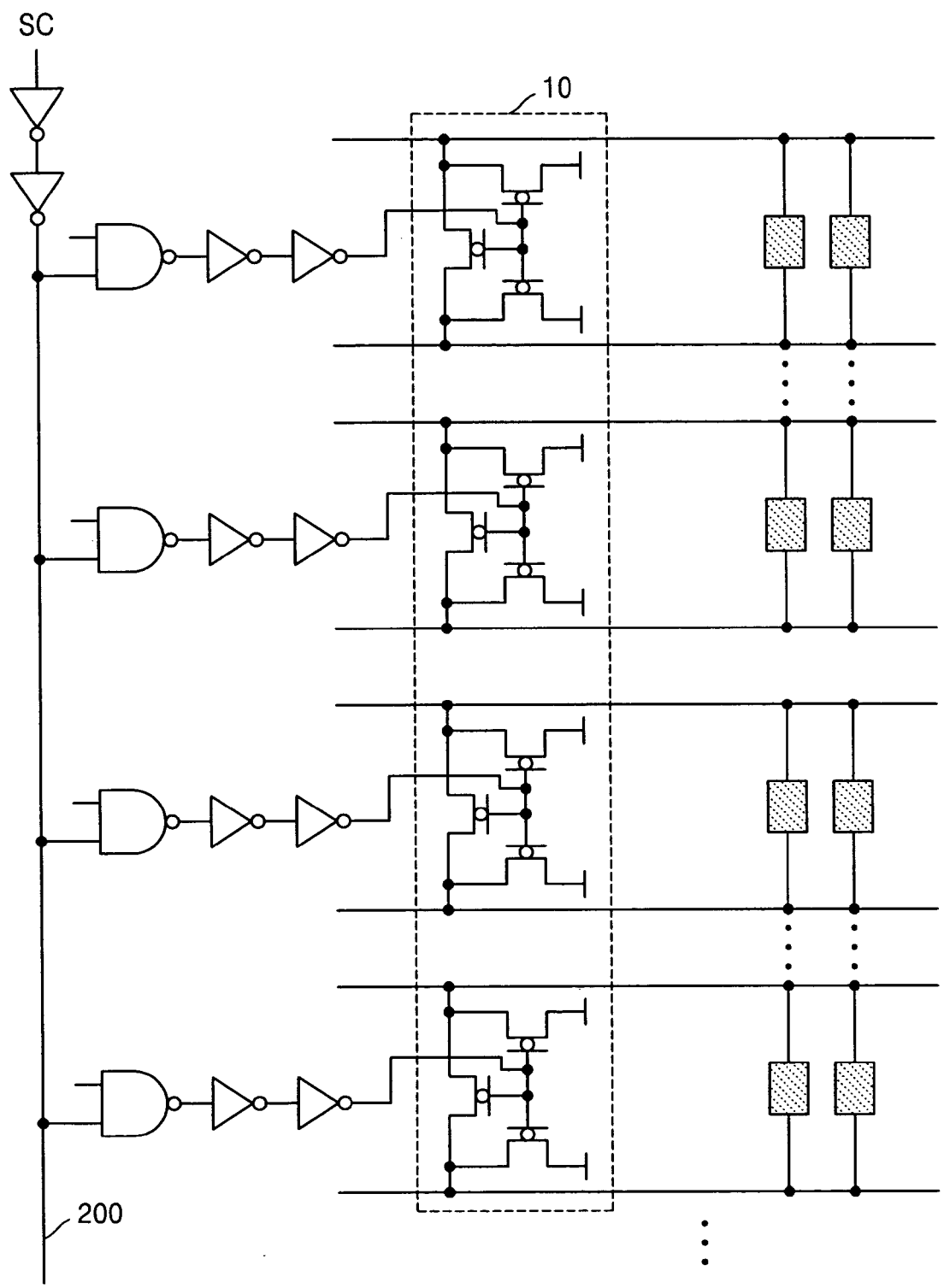
FIGS. 1 and 2 are circuit diagrams of wake-up circuits of a conventional SRAM (static random access memory) memory device.
Figure 2:
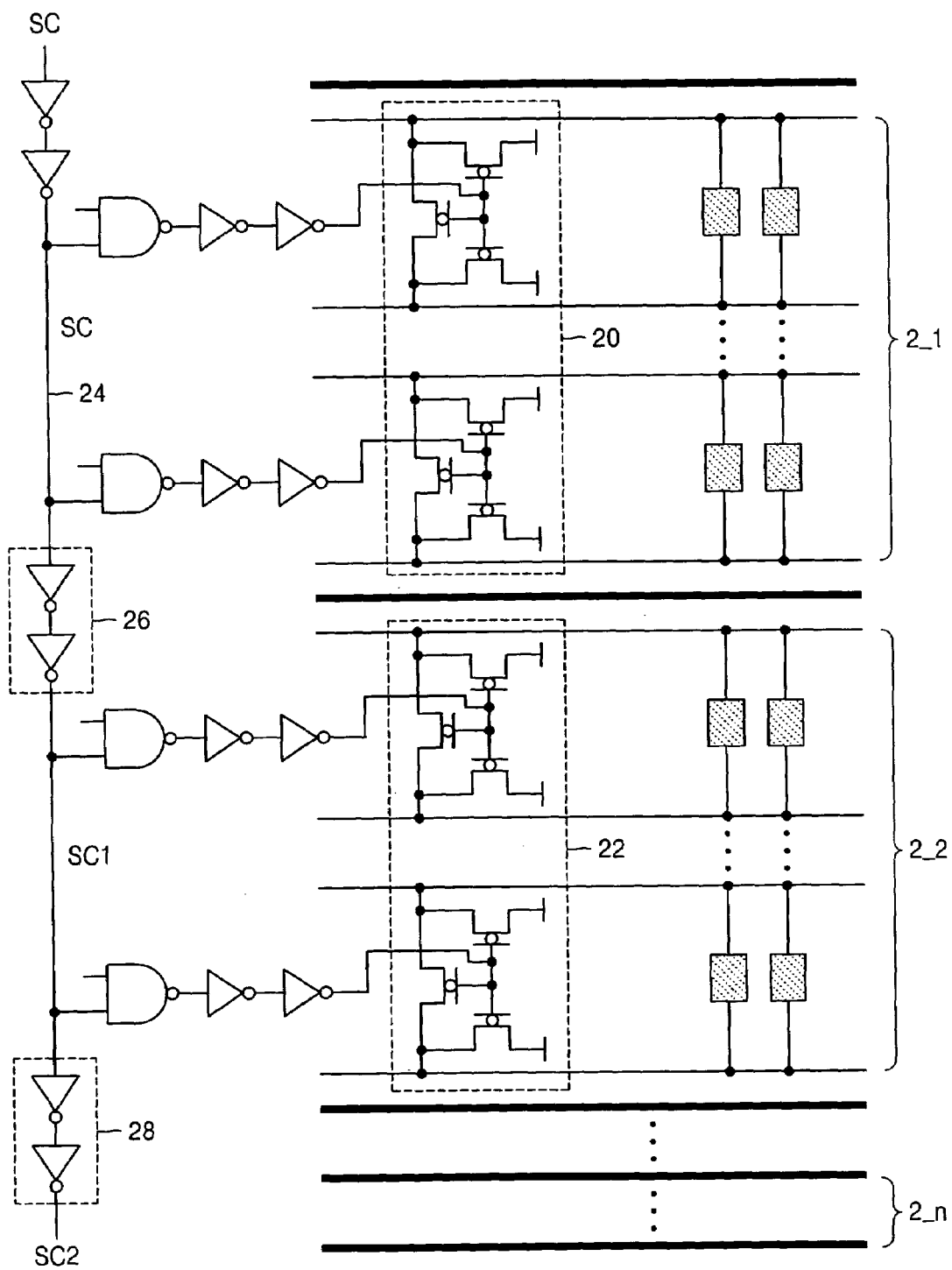
Figure 3:
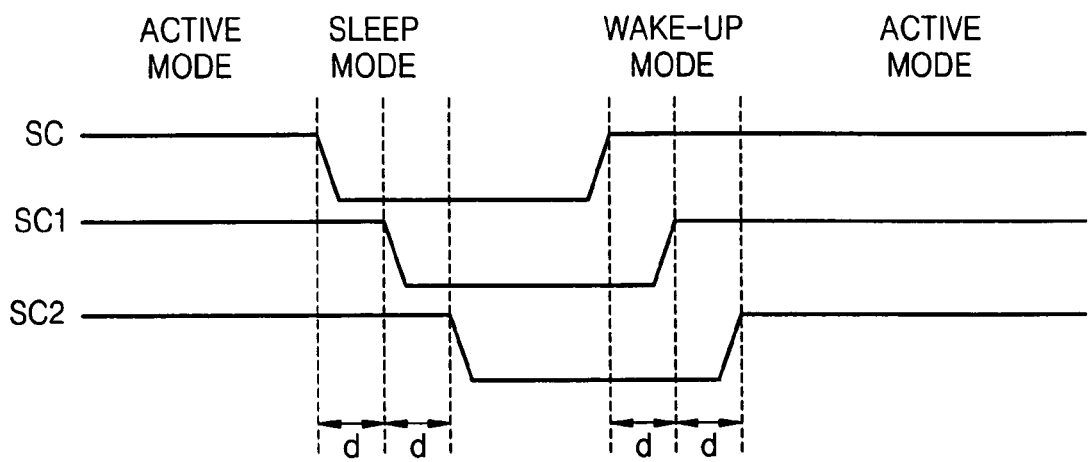
FIG. 3 is a timing diagram of control signals of the wake-up circuit illustrated in FIG. 2.

Using the wake-up circuit of the SRAM according to the present invention, overhead is less than when using the conventional inverter chain illustrated in FIG. 2. Further, the wake-up delay can be variably set based on the signal fedback from the bit lines, and thus, the peak current can be controlled. Also, using the wake-up circuit according to the present invention only affects the wake-up operation of the memory device and the speed of other operations of the device are not affected.

According to the present invention, the peak currents in the wake-up circuit can be controlled by using the signal fedback from bit line within a previous block to determine when to transmit the wake-up control signal. Further, because of the control in the peak currents, the change of the power supply voltage is reduced, and hence power noise is reduced and data of the memory cell can be preserved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A wake-up circuit of a memory device in which bit line pairs connected to a plurality of memory cells are precharged through a delay chain structure, the wake-up circuit comprising:
    a plurality of bit line pairs corresponding to a plurality of memory blocks;
    a wake-up control signal outputting unit that outputs a control signal for precharging the bit line pairs in order to wake-up the memory device from a sleep mode to an active mode; and
    a plurality of precharge delay units that transmits the control signal to bit line pairs associated with a subsequent memory block when the output control signal and bit line pairs within a previous memory block have undergone a wake-up operation.

2. The wake-up circuit of claim 1, wherein the control signal output from the wake-up control signal outputting unit is sequentially output to bit line pairs of the plurality of memory blocks via the precharge delay units.

3. The wake-up circuit of claim 1, further comprising:
    connection units that transmit the control signal to the bit lines; and
    precharge circuits respectively precharging the bit line pairs,
    wherein each connection unit includes:
        a NAND gate that performs a NAND operation on the control signal and a precharge signal; and
        a connection delay unit that delays the output of the NAND gate and that outputs the delayed output to the bit line pair.

4. The wake-up circuit of claim 3, wherein the connection delay unit includes a plurality of inverters.

5. The wake-up circuit of claim 4, wherein the control signal output from the connection delay unit is input to a precharge switch unit to deliver a power supply voltage to the bit line pair.

6. The wake-up circuit of claim 1, wherein the precharge delay unit includes:
    a first switch that delivers a signal from the bit line pairs to a first node in response to an output signal of the precharge delay unit;
    a NAND gate that performs a NAND operation on the control signal received from the previous block and a signal received from the first node and that outputs the result to a second node;
    a second switch that delivers a power supply voltage to the first node in response to a signal received from the second node; and
    an inverter that inverts the signal received from the second node and that transmits the control signal as the output signal of the precharge delay unit to the subsequent block.

7. The wake-up circuit of claim 6, wherein the first and second switches are PMOS transistors.

8. The wake-up circuit of claim 1, wherein the memory device is an SRAM (static random access memory) device.

9. A memory device comprising:
    a plurality of memory cells;

a plurality of bit line pairs connected to the plurality of memory cells and divided into a plurality of memory blocks;

a wake-up control signal outputting unit that outputs a control signal for precharging the bit line pairs in order to wake up the memory device from a sleep mode to an active mode; and a plurality of precharge delay units that transmit the control signal to bit line pairs associated with a subsequent memory block when the output control signal and bit line pairs within a previous memory block are determined to have performed a wake-up operation.

10. The memory device of claim 9, further comprising:

connection units that transmit the control signal to the bit lines; and precharge circuits respectively precharging the bit line pairs, wherein each connection unit includes:

a NAND gate that performs a NAND operation on the control signal and a precharge signal; and a connection delay unit that delays the output of the NAND gate and that outputs the delayed output to the bit line pair.

11. The memory device of claim 10, wherein the connection delay unit includes a plurality of inverters.

12. The memory device of claim 11, wherein the control signal output from the connection delay unit is input to a precharge switch unit to deliver a power supply voltage to the bit line pair.

13. The memory device of claim 9, wherein the precharge delay unit includes:

a first switch that delivers a signal from the bit line pairs to a first node in response to an output signal of the precharge delay unit;

a NAND gate that performs a NAND operation on the control signal received from the previous block and a signal received from the first node and that outputs the result to a second node;

a second switch that delivers a power supply voltage to the first node in response to a signal received from the second node; and an inverter that inverts the signal received from the second node and that transmits the control signal as the output signal of the precharge delay unit to the subsequent block.

14. The memory device of claim 13, wherein the first and second switches are PMOS transistors.

15. The memory device of claim 9, wherein the memory device is an SRAM device.

16. A wake-up method of a memory device in which bit line pairs of a plurality of memory cells divided into a plurality of memory blocks connected to a single word line are transitioned from a sleep mode to an active mode, the wake-up method comprising:

outputting a wake-up control signal;

precharging the bit line pairs corresponding to one of the memory blocks;

determining whether the bit line pairs within the one of the blocks have undergone a wake-up operation; and transmitting the wake-up control signal to bit line pairs corresponding to a subsequent block if the bit line pairs of the one of the blocks have undergone the wake-up operation.

17. The wake-up method of claim 16, wherein determining includes:

feeding back precharge voltages of the bit line pairs within the one of the blocks to a control signal delay unit in response to the wake-up control signal; and performing a logic operation on the precharge voltages of the bit line pairs corresponding to the one of the blocks and the wake-up control signal and outputting the result of the logic operating in the control signal delay unit.

18. The wake-up method of claim 16, wherein the memory device is an SRAM device.

* * * * *